(12) United States Patent
Kim et al.

(10) Patent No.: US 9,935,194 B2
(45) Date of Patent: Apr. 3, 2018

(54) 3D SEMICONDUCTOR INTEGRATED CIRCUIT DEVICE AND METHOD OF MANUFACTURING THE SAME

(71) Applicant: SK hynix Inc., Gyeonggi-do (KR)

(72) Inventors: Jin Ha Kim, Gyeonggi-do (KR); Jun Kwan Kim, Gyeonggi-do (KR); Kang Sik Choi, Gyeonggi-do (KR); Su Jin Chae, Gyeonggi-do (KR); Young Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/370,922

(22) Filed: Dec. 6, 2016

(65) Prior Publication Data

US 2017/0084740 A1    Mar. 23, 2017

Related U.S. Application Data

(62) Division of application No. 14/540,866, filed on Nov. 13, 2014, now Pat. No. 9,543,401.

(30) Foreign Application Priority Data

Aug. 8, 2014 (KR) ........................ 10-2014-0102518

(51) Int. Cl.
| | |
|---|---|
| *H01L 29/94* | (2006.01) |
| *H01L 21/336* | (2006.01) |
| *H01L 21/8238* | (2006.01) |
| *H01L 29/78* | (2006.01) |
| *H01L 21/28* | (2006.01) |

(Continued)

(52) U.S. Cl.
CPC .... *H01L 29/7827* (2013.01); *H01L 21/28518* (2013.01); *H01L 21/28531* (2013.01); *H01L 27/2454* (2013.01); *H01L 29/456* (2013.01); *H01L 21/76843* (2013.01); *H01L 21/76855* (2013.01)

(58) Field of Classification Search
CPC .......... H01L 27/10876; H01L 29/7827; H01L 27/108; H01L 27/10891
USPC .......... 257/328, 329, 401, E21.19; 438/253, 438/238, 269, 479, 481
See application file for complete search history.

(56) References Cited

U.S. PATENT DOCUMENTS

| | | | |
|---|---|---|---|
| 2002/0009882 A1* | 1/2002 | Shin ................. | H01L 21/28525 438/675 |
| 2003/0001290 A1* | 1/2003 | Nitayama ......... | H01L 27/10823 257/321 |

(Continued)

*Primary Examiner* — Kimberly Rizallah
*Assistant Examiner* — Brian Turner
(74) *Attorney, Agent, or Firm* — IP & T Group LLP

(57) ABSTRACT

A 3D semiconductor integrated circuit device and a method of manufacturing the same are provided. An active pillar is formed on a semiconductor substrate, and an interlayer insulating layer is formed so that the active pillar is buried in the interlayer insulating layer. The interlayer insulating layer is etched to form a hole so that the active pillar and a peripheral region of the active pillar are exposed. An etching process is performed on the peripheral region of the active pillar exposed through the hole by a certain depth, and a space having the depth is provided between the active pillar and the interlayer insulating layer. A silicon material layer is formed to be buried in the space having the depth, and an ohmic contact layer is formed on the silicon material layer and the active pillar.

7 Claims, 7 Drawing Sheets

(51) Int. Cl.
*H01L 27/24* (2006.01)
*H01L 29/45* (2006.01)
*H01L 21/285* (2006.01)
*H01L 21/768* (2006.01)

(56) References Cited

U.S. PATENT DOCUMENTS

2010/0001327 A1* 1/2010 Kim ................ H01L 21/823487
 257/296
2011/0163394 A1* 7/2011 Park ................ H01L 21/28052
 257/413

* cited by examiner

3D SEMICONDUCTOR INTEGRATED CIRCUIT DEVICE AND METHOD OF MANUFACTURING THE SAME

CROSS-REFERENCES TO RELATED APPLICATION

This application is a division of U.S. patent application Ser. No. 14/540,866 filed on Nov. 13, 2014, which claims priority under 35 U.S.C. 119(a) to Korean application No. 10-2014-0102518, filed on Aug. 8, 2014, in the Korean intellectual property Office. The disclosure of each of the foregoing application is incorporated by reference in its entirety.

BACKGROUND

1. Technical Field

Embodiments relate to a three dimensional (3D) semiconductor integrated circuit device and a method of manufacturing the same, and more particularly, to a semiconductor integrated circuit device having a wrap-around contact structure and a method of manufacturing the same.

2. Related Art

Memory devices are generally provided as internal semiconductor integrated circuit devices of computers or other electronic apparatuses. Typical examples of memory devices include random access memories (RAMs), read only memories (ROMs), dynamic RAMs (DRAMs), synchronous DRAM (SDRAM), flash memories, and variable resistive memory devices. Variable resistive memory devices include programmable conductive memory devices, resistive RAMs (ReRAMs), and phase-change RAMs (PCRAMs).

Nonvolatile memory devices may be used in broad electronic applications to provide high integration density, high reliability, and low power consumption.

Variable resistive memory devices may include a plurality of memory cells arranged in matrix form. The memory cells may include an access device such as a diode, a field effect transistor (FET), or a bipolar junction transistor (BJT). The access device may be coupled to a word line extending along a row of an array. Memory elements in the memory cells may be coupled to a bit line extending along a column of 1o the array. In this manner, the access device of the memory cell may select a word line coupled to a gate and the memory cell may be accessed through a row decoder which activates the rows of the memory cell.

Currently, a transistor having a 3D vertical channel structure is used as the access device of the memory cells to increase integration density. As is well-known, a transistor having the 3D vertical channel structure may include a pillar-shaped active region, a gate formed on an outer circumference of the active region, a drain formed in an upper portion of the active region, and a source formed in a lower portion of the active region or formed in a semiconductor substrate which is in contact with the lower portion of the active region. A heating electrode, a variable resistance layer, and a bit line are sequentially formed to be electrically coupled to the drain of the transistor, and thus the resistive memory cell is completed.

To obtain ohmic contact between the drain and the heating electrode, a silicide layer is formed between the drain and the heating electrode. Currently, endeavors for improving the operation current in the variable resistive memory device continue, and thus, technology for improving contact properties between the drain and the silicide layer or between a lower electrode and the silicide layer has been suggested.

SUMMARY

According to an embodiment, there is provided a method of manufacturing a semiconductor integrated circuit device. An active pillar is formed on a semiconductor substrate, and an interlayer insulating layer is formed so that the active pillar is buried in the interayer insulating layer. The interlayer insulating layer is etched to form a hole so that the active pillar and a peripheral region of the active pillar are exposed. An etching process is performed on the peripheral region of the active pillar exposed by the hole to certain depth, and a space having the depth is provided between the active pillar and the interlayer insulating layer. A silicon material layer is formed to be buried in the space having the depth, and an ohmic contact layer is formed on the silicon material layer and the active pillar.

According to an embodiment, there is provided a method of manufacturing a semiconductor integrated circuit device. Active pillars, each of which include a gate insulating layer and a gate electrode, are surrounded on an outer circumference, are prepared on a semiconductor substrate, and an interlayer insulating layer is formed to be buried between the active pillars. The interlayer insulating layer is etched to form a hole so that a top of the active pillar and the gate insulating layer are exposed. The exposed gate insulating layer is etched by a certain depth to form a space between the interlayer insulating layer and the active pillar, and a silicon material is formed in the space. An ohmic contact layer is formed on the silicon material and the active pillar, and a lower electrode and a variable resistance material layer are sequentially formed on the ohmic contact layer.

According to an embodiment, there is provided a semiconductor integrated circuit device. The semiconductor integrated circuit device may include an active pillar of which a gate electrode is covered on an outer circumference, a drain region is formed in a portion over the gate electrode, and a source region is formed in a portion below the gate electrode, a gate insulating layer located between the active pillar and the gate electrode, a contact extension region located on an outer circumference of the drain region in the active pillar and the gate insulating layer, and an ohmic contact layer formed on the contact extension region.

The contact extension region may be formed on the outer circumference of the active pillar in a cylinder form. Alternatively, the contact extension region may be formed in a cap form to cover the outer circumference of the active pillar and a top of the active pillar.

These and other features, aspects, and embodiments are described below in the section entitled "DETAILED DESCRIPTION".

BRIEF DESCRIPTION OF THE DRAWINGS

The above and other aspects, features and other advantages of embodiments will be more clearly understood from the following detailed description taken in conjunction with the accompanying drawings, in which.

DETAILED DESCRIPTION

Figure 1:
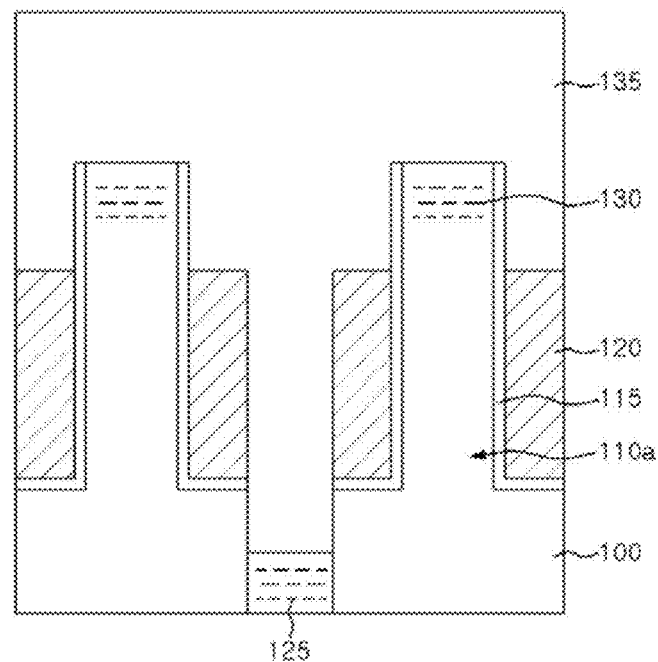
FIGS. 1 to 8 are cross-sectional views illustrating a method of manufacturing a semiconductor integrated circuit device according to an embodiment.

Hereinafter, exemplary embodiments will be described in greater detail with reference to the accompanying drawings. Exemplary embodiments are described herein with reference to cross-sectional illustrations that are schematic illustrations of the exemplary embodiments (and intermediate structures). Modifications in the shape of the illustrations are possible due to differences in manufacturing techniques and/or tolerances. Thus, exemplary embodiments should not be construed as limited to the particular shapes of regions illustrated. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may be present.

It is not intended that the embodiments be limited to the drawings. Although a few embodiments will be shown and described, it will be appreciated that changes may be made to these exemplary embodiments with the resultant still falling within the spirit and scope of the invention.

Referring to FIG. 1, a pillar 110a may be formed in a predetermined region of a semiconductor substrate 100 through a general method. The pillar 110a may be formed by etching the semiconductor substrate 100. Alternatively, the pillar 110a may be formed by depositing a semiconductor layer (not shown) on the semiconductor substrate 100 and etching a predetermined portion of the semiconductor layer. The pillar 110a may correspond to an active region of a transistor. After the pillar 110a is formed, a channel and drain may be formed in the pillar 110a. A gate insulating layer 115 is formed on a sidewall of the pillar 110a and on a surface of the semiconductor substrate 100 between pillars 110a. The gate insulating layer 115 may be formed by oxidizing a surface of the semiconductor substrate 100 in which the pillar 110a is formed. A conductive material layer (not shown) may be formed on the semiconductor substrate 100 in which the gate insulating layer 115 is formed, and then anisotropically etched. Thus, a surrounding gate 120 may be formed on the sidewall of the pillar 110a. The surrounding gate 120 may be formed at a level lower than that of the pillar 110a. The surrounding gate 120 is etched to be isolated from neighboring surrounding gate 120. First high concentration impurities may be implanted into a lower portion of the isolation region to form a preliminary source region 125. In the process of forming the surrounding gate 120, the gate insulating layer 115 located on the top of the pillar 110a may be removed as shown in FIG. 1. Second high concentration impurities 130 may be implanted in an exposed upper portion of the pillar 110a for forming a junction region. An interlayer insulating layer 135 may be formed to insulate the pillars 110a. The interlayer insulating layer 135 may extend to a level higher than that of an upper surface of the pillar 110a so that the pillars 110a may be sufficiently buried in the interlayer insulting layer 135 and a lower electrode region or a variable resistance region be defined over each of the pillars 110a. The interlayer insulating layer 135 may be, for example, a silicon nitride layer.

Figure 2:
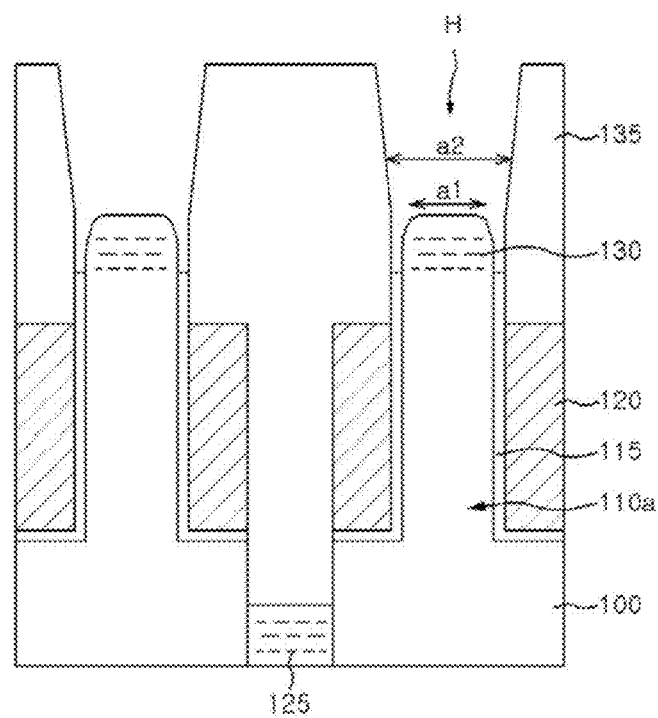

Referring to FIG. 2, the interlayer insulating layer 135 is etched to form a hole H so that an upper surface of the pillar 110a and an upper sidewall of the pillar 110a are exposed by the hole H. For example, the hole H may be formed to expose the gate insulating layer 115 formed on the outer circumference of the pillar 110a. Thus, a width a2 of the hole H may be set larger than a sum of a width a1 of the pillar 110a and a thickness (or a width) of the gate insulating layer 115. Then, the gate insulating layer 115 exposed through the hole H is etched by a certain thickness to form a space between the pillar 110a and the interlayer insulating layer 135 so that an upper sidewall of the pillar 110a is exposed.

Figure 3:
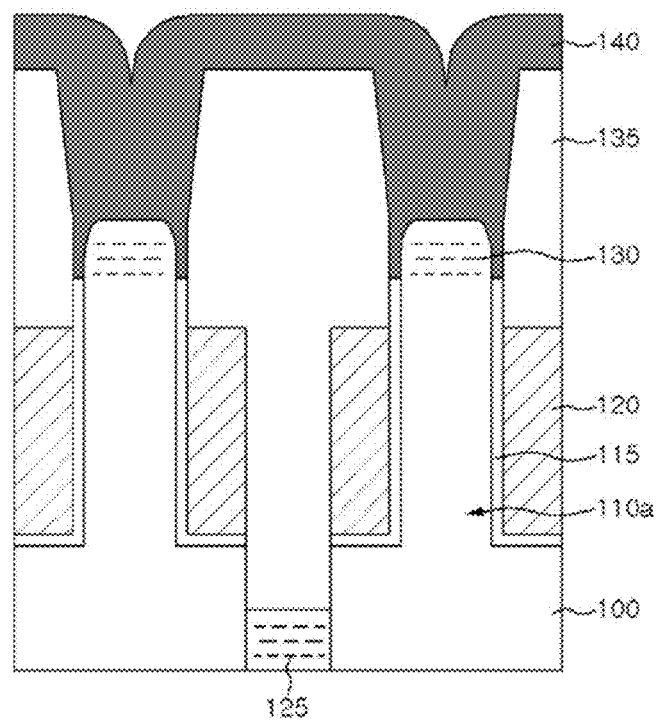

Referring to FIG. 3, a silicon material 140 may sufficiently fill in the hole H and the space which is created by removing the gate insulating layer 115 between the interlayer insulating layer 135 and the pillar 110a. The silicon material 140 may be an undoped polysilicon layer, and may be formed through a low temperature chemical vapor deposition (CVD) method to easily fill in the space.

Figure 4:
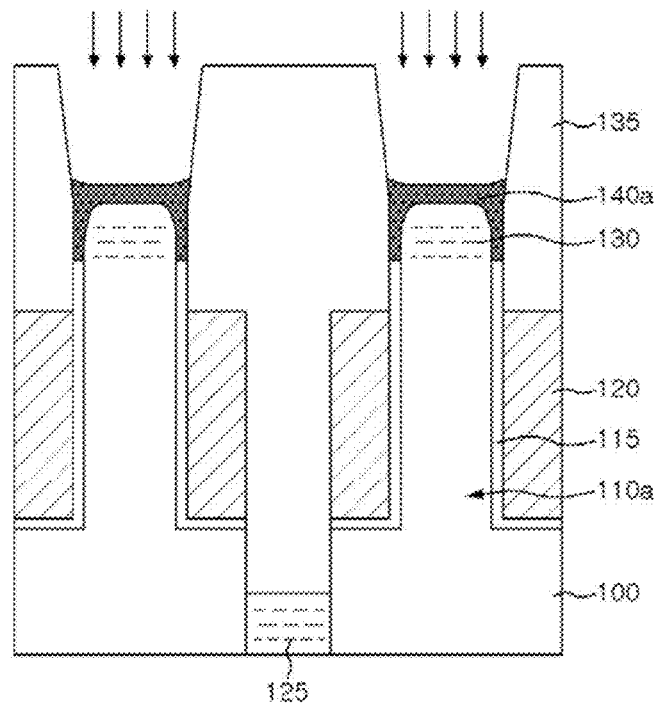
Figure 5:
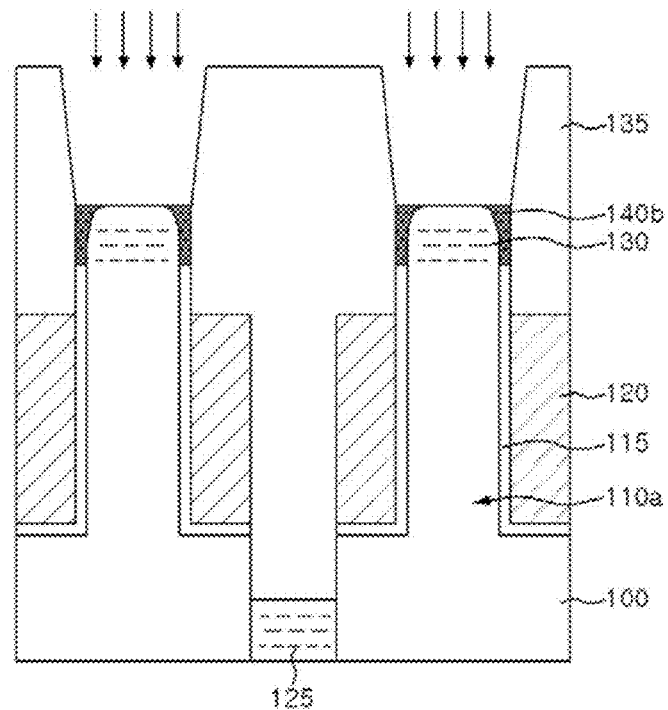

Referring to FIG. 4, a chemical mechanical polishing (CMP) process may be performed on the silicon material 140 so that the interlayer insulating layer 135 is exposed. Then, the silicon material 140 may be further etched back to be left in a bottom portion of the hole H. The silicon material 140 may be provided on an upper portion of the pillar 110a and extend between the Interlayer insulating layer 135 and the pillar 110a to fill in the space. Under this structure, the silicon material 140 may be in a cap shape, as shown in FIG. 4. In another embodiment, the silicon material 140 may be etched back until the pillar 110a is exposed. Under this structure, the silicon material 140 may fill in the space between the interlayer insulating layer 135 and the pillar 110a and may be in a cylinder shape, as shown in FIG. 5. In FIGS. 4 and 5, the reference numerals 140a and 140b denote etched-back silicon materials. In the etch back process of the silicon material 140, a surface of the Interlayer insulating layer 135 may be also etched back by a certain thickness. Then, an impurity may be implanted into the silicon material 140a or 140b so that the silicon material 140a or 140b may have substantially the same concentration as the upper portion of the pillar 110a. The silicon material 140a or 140b is located on an upper surface of or an outer circumference of the pillar 110a and serves as a contact extension region.

Figure 6:
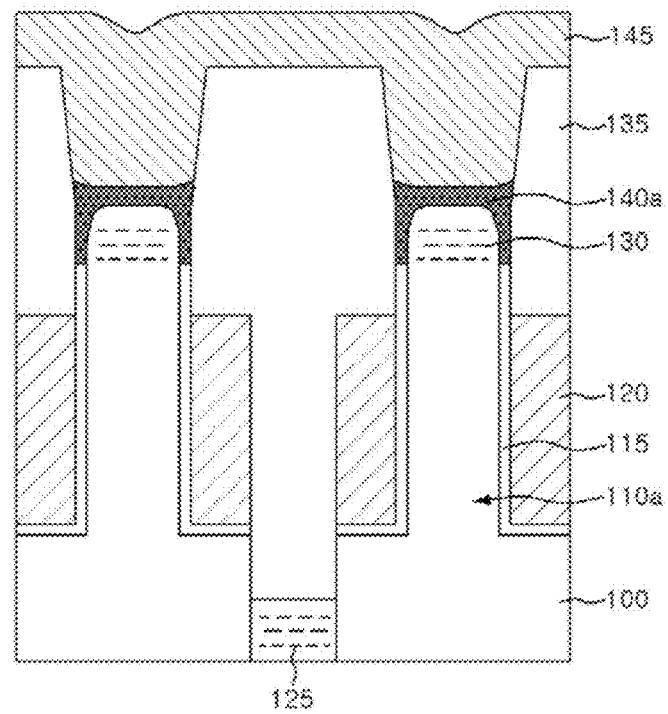

Referring to FIG. 6, a metal layer 145 may be deposited on a upper surface of the silicon material 140a or 140b and the pillar 110a to fill in the hole H. For example, the metal layer 145 may include a stacked layer of a titanium layer and a titanium nitride layer. FIG. 6 illustrates the metal layer 145 formed on the semiconductor substrate in which the silicon material 140a is formed, as illustrated in FIG. 4. However, in another embodiment, the metal layer 145 may be formed on the semiconductor substrate in which the silicon material 140b is formed, as shown in FIG. 5.

Figure 7:
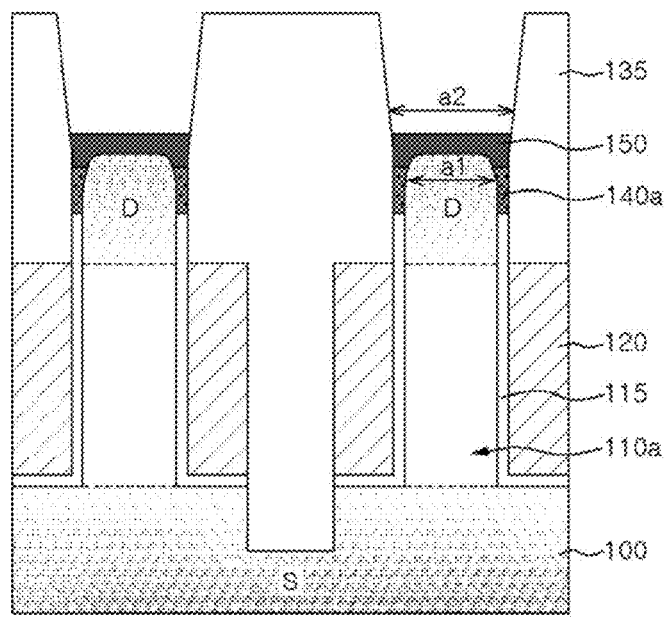

Referring to FIG. 7, a heat treatment process may be performed so that the metal layer 145 and the silicon material 140a (or the metal layer 145, the pillar 110a, and the silicon material 140b) react with each other. Thus, the surface of the silicon material 140a or 140b and the surface of the pillar 110a, which is in contact with the metal layer 145, reacts with the metal layer 145 to form a silicide layer 150, which serves as an ohmic contact layer, on the pillar 110a and the silicon material 140a or 140b. The silicide layer 150 may have substantially the same width as the width a2 of the hole H. By controlling the heat treatment process, the silicide layer 150 may extend along a lateral surface of the pillar 110a, and thus a contact area of the silicide layer 150 with the pillar 110a may further extend. Further, by controlling the heat treatment reaction, the silicon material 140a or 140b may be entirely or partially changed into the silicide layer. Then, the non-reacted metal layer 145 may be removed through a general method. Thus, a silicide area of the silicide layer, which is in contact with a lower electrode and drain region to be formed later, may be substantially increased, and the contact areas of the silicide layer with the lower electrode and the drain region may be increased.

In the heat treatment process of the silicon material 140a or 140b, the impurity implanted in the upper portion of the pillar 110a and the impurity implanted in the preliminary source region 125 below the pillar 110a may be activated, and a common source region S may be formed below the pillar 110a and a drain region D may be formed in the upper portion of the pillar 110a.

Figure 8:
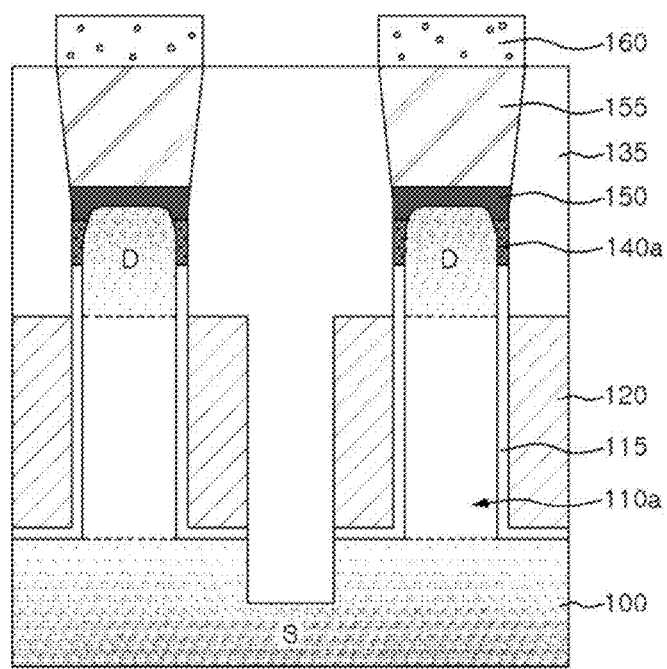

Referring to FIG. 8, a lower electrode 155 is formed in the hole H through a general method to be in contact with the silicide layer 150, and a variable resistance material layer 160 is formed on the lower electrode 155. In another embodiment, the lower electrode 155 and the variable resistance material layer 160 may be buried within the hole H. The variable resistance material layer 160 may include various materials such as a PCMO ($Pr_{1-x}Ca_xMnO_3$) layer for a ReRAM, a chalcogenide layer for a PCRAM, a magnetic layer for a MRAM, a magnetization reversal device layer for a spin-transfer torque magnetoresistive RAM (STTMRAM), or a polymer layer for a polymer RAM (PoRAM).

According to the embodiment, since an area of the silicide layer 150 serving as an ohmic contact layer extends through the contact extension region which is provided on the outer circumference of the pillar, a contact area between the lower electrode 155 and the silicide layer 150 and a contact area between the silicide layer 150 and the drain D may increase, and contact resistance may reduce. Thus, a turn-on current characteristic of a switching device of a variable resistive memory apparatus may improve.

Figure 9:
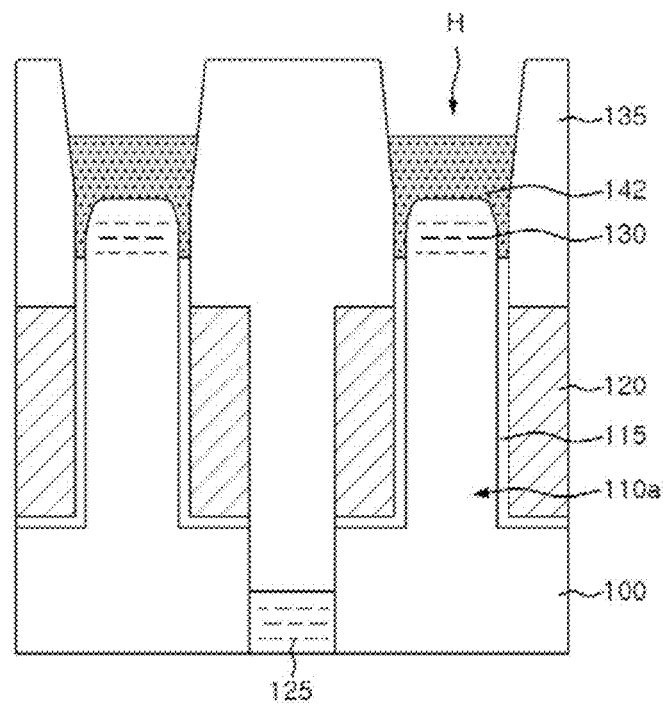
FIGS. 9 to 12 are cross-sectional views illustrating a method of manufacturing a semiconductor integrated circuit device according to an embodiment.

In another embodiment, the silicon material 140 may be replaced with a selective epitaxial growth (SEG) layer 142, as shown in FIG. 9. Specifically, after the hole H exposing the top and upper sidewall of the pillar 110a is formed, the selective epitaxial growth (SEG) layer 142 may be grown. As is known, the SEG layer 142 has a single crystalline structure and may be grown using a silicon material as a seed. In an embodiment, the SEG layer 142 is grown to a certain thickness using the exposed top and upper sidewall of the pillar 110a as a seed. The SEG layer 142 may extend between the pillar 110a and the interlayer insulating layer 135 to a thickness 10 to 20% larger than or smaller than a target thickness of the silicide layer, which will be formed later. The SEG layer 142 may include a doped SEG layer. That is, the growth process and the impurity implantation process may be simultaneously performed by forming the SEG layer 142 containing impurities. When the doped SEG layer 142 is formed through the above-described process, the SEG layer 142 may have an impurity concentration profile in which an impurity concentration gradually reduces when going down from a top of the SEG layer 142 toward the semiconductor substrate 100. Therefore, the silicide layer may be easily formed and a junction region may be easily defined in a subsequent process. The embodiments are not limited to by this method of forming the doped SEG layer. In another embodiment, for example, the doped SEG layer may be formed by forming an undoped SEG layer and Implanting an Impurity through a separate impurity implantation process.

Figure 10:
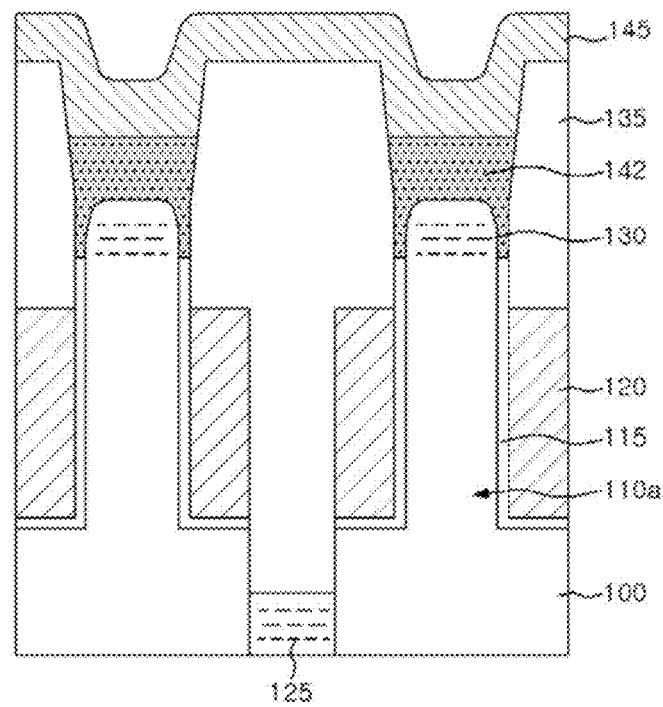

Referring to FIG. 10, a metal layer 145 is formed on the SEG layer 142.

Figure 11:
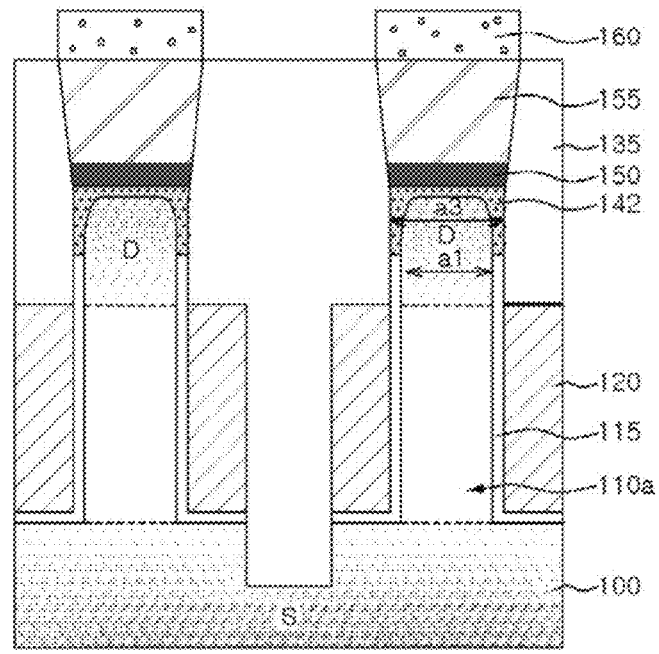

Referring to FIG. 11, the metal layer 145 reacts with the SEG layer 142 through a heat treatment process to form a silicide layer 150. Since a width a2 of the SEG layer 142 is substantially larger than the width a1 of the pillar 110a, the width of the silicide layer 150 formed on the SEG layer 142 may be the width a2 of the SEG layer 142, which is larger than the width a1 of the pillar 110a. Therefore, a contact area between a lower electrode, which will be formed later, and the silicide layer 150 increases. In the heat treatment process of forming the silicide layer 150, the impurity implanted in the upper portion of the pillar 110a and the Impurity implanted below the pillar 110a may be activated. A non-reacted metal layer 145 may be removed. A heating electrode 155 and a variable resistive pattern 160 may be sequentially formed on the silicide layer 150. As a result, a common source region S may be formed below the pillar 110a and a drain region D may be formed in the upper portion of the pillar 110a.

Figure 12:
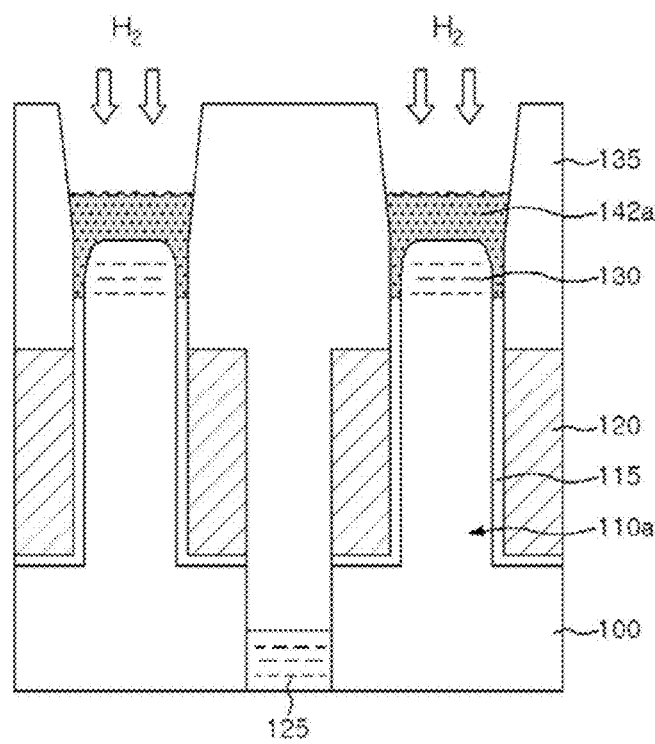

Referring to FIG. 12, after the SEG layer 142 is formed as shown in FIG. 11, a heat treatment process may be further performed against a surface of the SEG layer 142 in an atmosphere of hydrogen ($H_2$). When the heat treatment process is performed in the atmosphere of hydrogen ($H_2$), impurities in the inside of the SEG layer 142 may be activated and then move upward to the surface of the SEG layer 142. Thus, an SEG layer 142a ends up with a waved surface topology. Due to the waved surface of the SEG layer 142a, the surface area of the SEG layer 142a significantly increases. In lieu of the hydrogen heat treatment process, any process capable of causing a waved surface topology may be employed.

Figure 13:
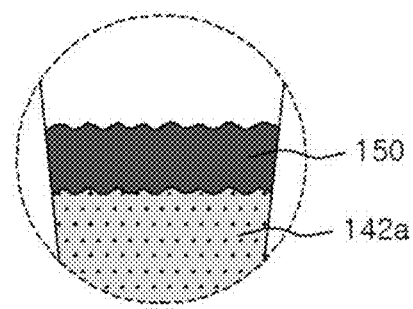
FIG. 13 is an enlarged cross-sectional view of a contact portion between a selective epitaxial growth (SEG) layer and a silicide layer of FIG. 12.

Referring to FIG. 13, a metal layer is deposited on the SEG layer 142a having the waved surface topology and subject to heat treatment to form a silicide layer 150 as described above. Therefore, the contact area between the SEG layer 142a and the silicide layer 150 may increase due to the waved surface topology of the SEG layer 142a, and thus the contact resistance between the SEG layer 142a and the silicide layer 150 may decrease. In an embodiment, the topology of the SEG layer 142a is transferred to the silicide layer 150, and thus the silicide layer 150 may also have a waved surface topology. Therefore, a contact area between the silicide layer 150 and a lower electrode, which is formed later, may increase.

The above embodiments are illustrative and not limitative. Various modifications are possible. Embodiments are not limited to any specific type of semiconductor device.

What is claimed is:
1. A semiconductor integrated circuit device comprising:
an active pillar extending upward from a substrate;
a gate electrode provided over a lower sidewall of the active pillar;
a drain region formed in an upper portion of the active pillar;
a source region formed in the substrate between a bottom portion of the active pillar and a bottom portion of a neighboring active pillar;
a gate insulating layer located between the active pillar and the gate electrode;
a contact extension region extending from the gate insulating layer to over an upper sidewall of the active pillar for extending an area of the drain region, wherein the contact extension region has a same concentration as the drain region; and
an ohmic contact layer formed in the contact extension region,
wherein a material of the contact extension region is different from that of the ohmic contact layer.

2. The semiconductor integrated circuit device of claim 1, wherein the contact extension region surrounds the upper sidewall of the active pillar.

3. The semiconductor integrated circuit device of claim 2, wherein the ohmic contact layer is in electrical contact with the active pillar and the contact extension region.

4. The semiconductor integrated circuit device of claim 1, wherein the contact extension region includes a polysilicon layer with conductive dopant.

5. The semiconductor integrated circuit device of claim 1, wherein the contact extension region includes a selective epitaxial growth (SEG) silicon layer.

6. The semiconductor integrated circuit device of claim 4, wherein the ohmic contact layer includes a metal.

7. The semiconductor integrated circuit device of claim 5, wherein the ohmic contact layer includes a metal.

* * * * *